(12) United States Patent
Lin et al.

(10) Patent No.: US 10,694,638 B1
(45) Date of Patent: Jun. 23, 2020

(54) ELECTRONIC DEVICE WITH HEAT DISSIPATION MODULES

(71) Applicant: NANNING FUGUI PRECISION INDUSTRIAL CO., LTD., Nanning (CN)

(72) Inventors: Huan-Ze Lin, New Taipei (TW); Yun-Nien Mi, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 16/414,326

(22) Filed: May 16, 2019

(51) Int. Cl.
*H05K 7/20* (2006.01)
*F28F 13/00* (2006.01)

(52) U.S. Cl.
CPC ......... *H05K 7/20163* (2013.01); *F28F 13/00* (2013.01); *H05K 7/20209* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 7,969,738 | B2* | 6/2011 | Koo | F25B 21/02 136/211 |
| 9,322,580 | B2* | 4/2016 | Hershberger | H05K 1/0203 |
| 9,671,141 | B2* | 6/2017 | Kim | F25B 21/02 |
| 2003/0183269 | A1* | 10/2003 | Maeda | G06F 1/203 136/211 |
| 2008/0298069 | A1* | 12/2008 | Chu | F21V 29/54 362/294 |
| 2009/0072385 | A1* | 3/2009 | Alley | H01L 24/16 257/713 |
| 2009/0205696 | A1* | 8/2009 | Koester | H01L 23/38 136/201 |
| 2010/0281884 | A1* | 11/2010 | Rawski | F25B 21/04 62/3.6 |
| 2012/0055170 | A1* | 3/2012 | Lilke | F24F 5/0042 62/3.3 |

FOREIGN PATENT DOCUMENTS

CN 206431547 U 8/2017

* cited by examiner

*Primary Examiner* — Courtney L Smith
(74) *Attorney, Agent, or Firm* — ScienBiziP, P.C.

(57) ABSTRACT

A system for cooling an electronic device applying the Peltier effect includes case, flow guiding device, heat dissipation module, and electronic component needing cooling in specific regions. The case has air inlet and heat outlet enclosing an internal space. The internal space includes cooling and heat exhausting regions. The flow guiding device is disposed around the air inlet to guide cooling medium into the internal space. The heat dissipation module includes a cooling device with hot and cold sides, the heat being exchanged from cold side to hot side. The cold side is coupled to the cooling region, the hot side to the heat exhausting region. The electronic component is coupled to the cooling region. The cooling medium flowing through the cooling region is cooled by the cold side and decreases the overall temperature of the electronic component or specific regions thereof.

17 Claims, 5 Drawing Sheets

ELECTRONIC DEVICE WITH HEAT DISSIPATION MODULES

FIELD

The subject matter herein generally relates to cooling electronic devices.

BACKGROUND

Conventional electronic devices such as a server or router have a central processing unit. As speeds of the central processing unit increase, the temperature of the processing unit may also increases. If the heat generated by the operation of the processing unit is not dissipated, the processing unit may shut down or burn out. Conventionally, external air is introduced through a cooling fan to generally cool the processing unit. However, reducing the temperature of the processing unit in a specific internal area is problematic.

Therefore, there is room for improvement within the art.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
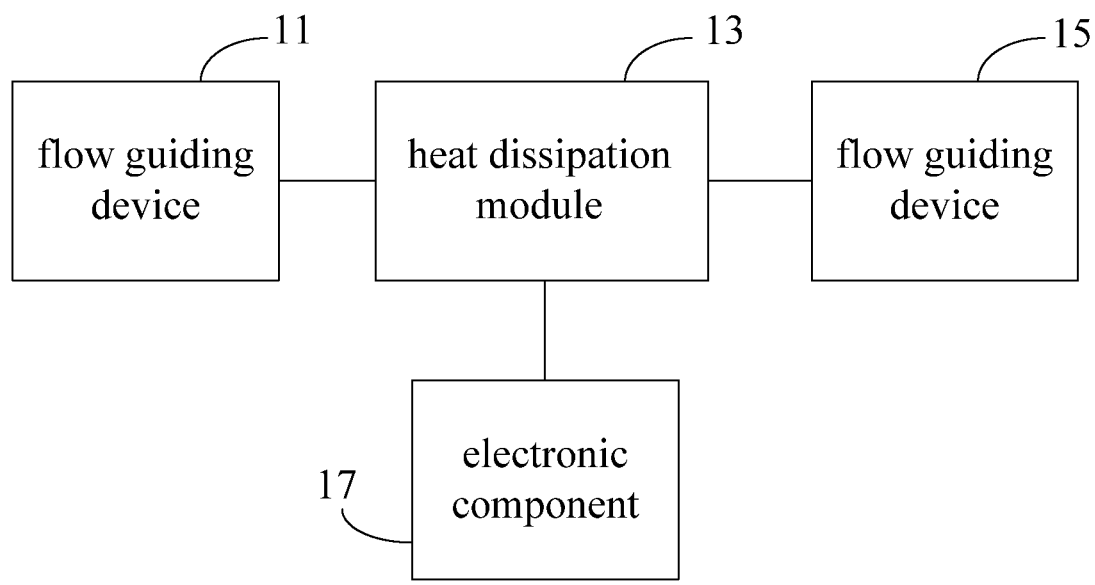
FIG. 1 is a block diagram of an electronic device according to an embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates block diagrams of an electronic device according to an embodiment of the disclosure. In FIG. 1, the electronic device may comprise flow guiding devices 11 and 15, heat dissipation module 13, and electronic components 17. The flow guiding device 11 may be a pump or fan to guide a cooling medium to the heat dissipation module 13. In an embodiment, the cooling medium can be airflow. The flow guiding device 15 decreases the temperature of the heat dissipation module 13. The heat dissipation module 13 decreases the temperature of the electronic components 17. According to an embodiment of the disclosure, the electronic components 17 may comprise central processing units (CPU), microprocessors (MPU), graphics processing units, and chipset components, or other electronic components generating heat.

Figure 2:
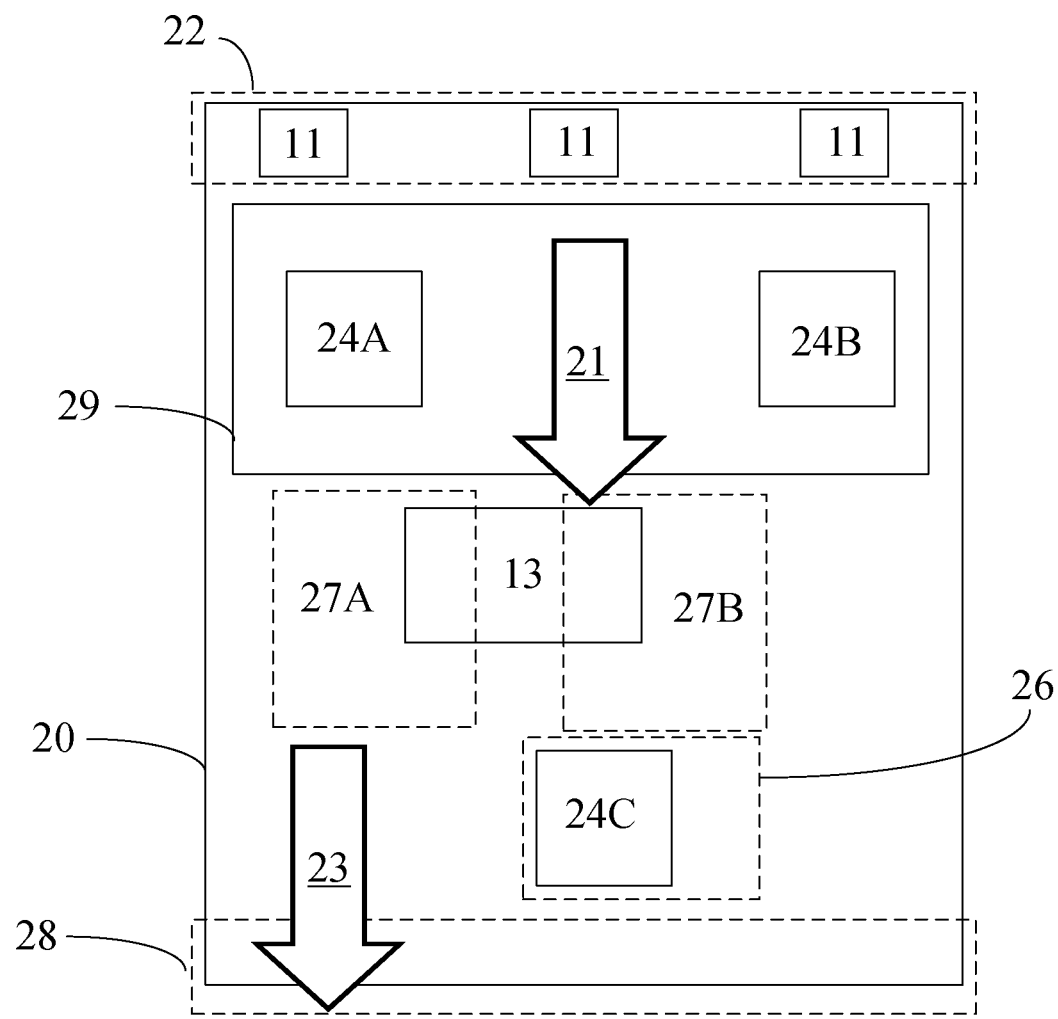
FIG. 2 is a perspective view of an electronic device according to an embodiment of the disclosure.

FIG. 2 shows an internal structure of an electronic device according to an embodiment of the disclosure. The electronic device comprises case 20, and the case 20 encloses an internal space. There are air inlet 22 and heat outlet 28 in the internal space. As illustrated in FIG. 2, air inlet 22 comprises a plurality of flow guiding devices 11. The flow guiding devices 11 can be fans. By directing the air outside the case 20 into the internal space through the flow guiding device 11, a cooling medium 21, such as cooling airflow, can be applied. The internal space enclosed by the case 20 may comprise electronic components 24A, 24B, and 24C and heat dissipation module 13. There are heat releasing region 27A, cooling region 27B, and heat source region 29 in the internal space.

There are electronic components 24A and 24B in the heat source region 29. According to an embodiment of the disclosure, the electronic components 24A and 24B may be CPUs, and the electronic components 24C may be chipset components. Since a large amount of heat is generated by the CPUs, the temperature of the cooling medium 21 introduced by the flow guiding device 11 flowing through the heat source region 29 is increased, thereby affecting the ability to cool the electronic component 24C. Therefore, according to an embodiment of the disclosure, the heat dissipation module 13 is disposed in a region between the heat source region 29 and the electronic component 24C to cool the cooling medium 21, so that the cooling medium 21 can cool the electronic component 24C.

Figure 3:
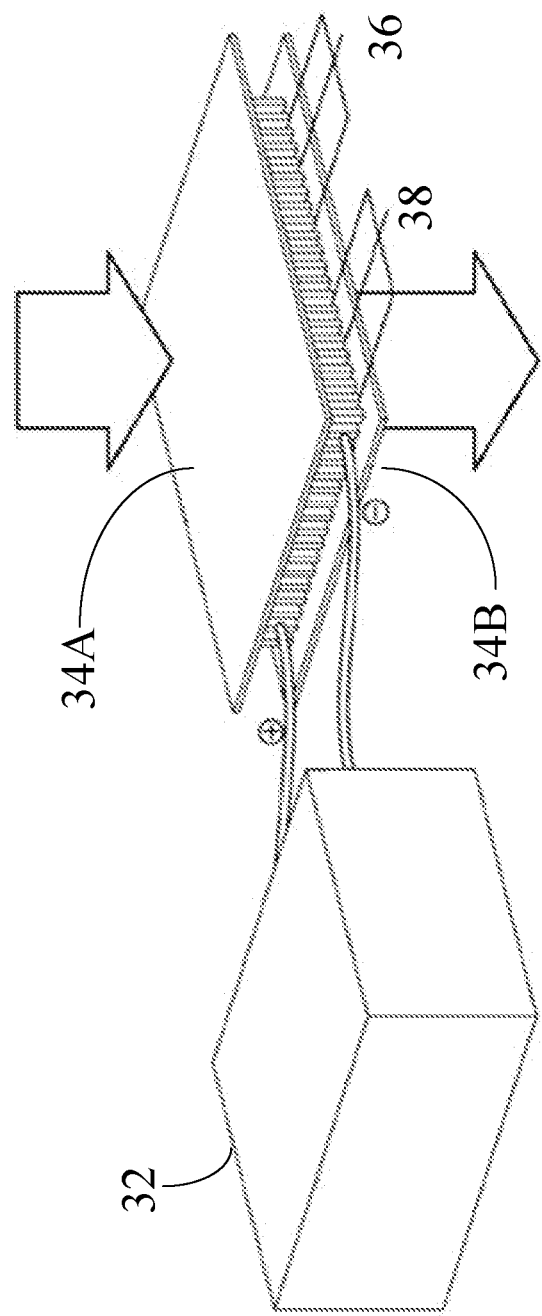
FIG. 3 is a perspective view showing a thermoelectric cooling device according to an embodiment of the disclosure.

The heat dissipation module 13 comprises a plurality of cooling devices. According to an embodiment of the disclosure, the cooling device may be a thermoelectric cooling (TEC) device (first cooling device). FIG. 3 shows a thermoelectric cooling device according to an embodiment of the disclosure. A thermoelectric cooling device is a solid state component that uses current to control heat flow, utilizing Peltier effect. A current supplied by a power source 32 passes through the ceramic substrates 34A and 34B. P-type and N-type semiconductor elements 36 and 38 are provided between the ceramic substrates 34A and 34B, electrically connected in series, and are thermally coupled in parallel to the ceramic substrates 34A and 34B. When electrical current passes through the P-type and N-type semiconductor elements 36 and 38, the temperature of the ceramic substrate 34A is lowered on one side (the cold side). Heat is released from the ceramic substrate 34B as the electrons return from the high energy state to the low energy state, forming another side which is hot (the hot side). The structures and functions of the thermoelectric cooling device are known to those skilled in the art, detailed descriptions of the thermoelectric cooling device is not included in the present disclosure.

Figure 4:
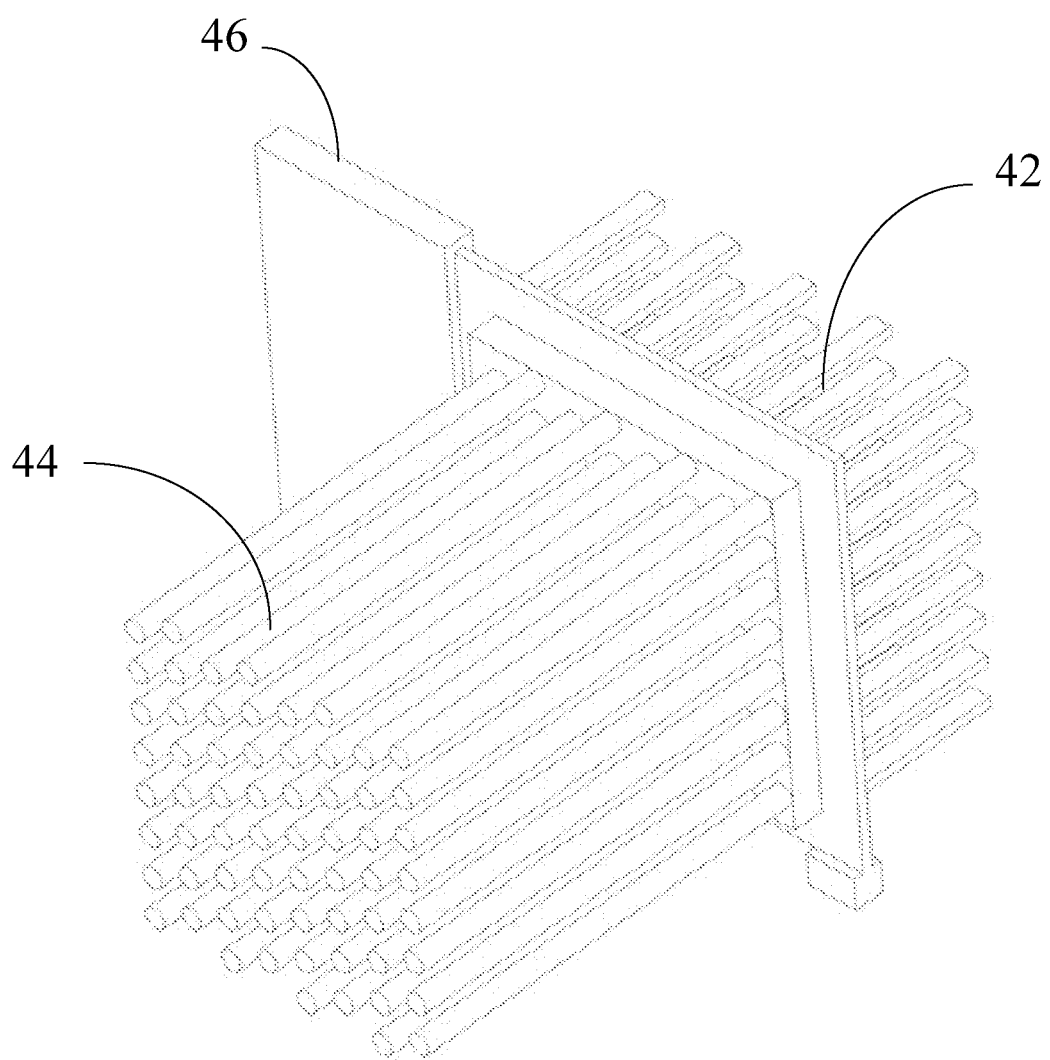
FIG. 4 is a perspective view showing the heat dissipation module according to an embodiment of the disclosure.

FIG. 4 shows the heat dissipation module 13 according to an embodiment of the disclosure. The heat sink fin 42 is in contact with the hot side of the thermoelectric cooling device, the heat sink fin 44 is in contact with the cold side of the thermoelectric cooling device. The thermoelectric cooling devices are disposed between the heat sink fins 42 and 44. According to an embodiment of the disclosure, there may be multiple thermoelectric cooling devices (first and second cooling devices) between the heat sink fins 42 and 44, such that the thermoelectric cooling devices can alternately perform thermal conversion and have sufficient individual time to return to an original state. According to an embodiment of the disclosure, the heat sink fin 42 in contact with the hot side of the thermoelectric cooling device is smaller than the heat sink fin 44. In one embodiment, to improve the efficiency of heat dissipation, another one of the flow guiding device may be disposed, such as the flow guiding device 15 of FIG. 1, to extract the hot air adjacent to the heat sink fin 42. According to an embodiment of the disclosure, baffle 46 is disposed between the heat sink fins 42 and 44 to prevent hot air of the heat sink fin 42 from flowing back to the heat sink fin 44.

As shown in FIG. 2, the cold side of the thermoelectric cooling device of the heat dissipation module 13 is disposed adjacent to the cooling region 27B. The hot side of the thermoelectric cooling device is disposed adjacent to the heat release region 27A. When the cooling medium 21 introduced by the flow guiding device 11 flows through the heat source region 29, the temperature of the cooling medium 21 rises. The cooling medium 21 is cooled by the heat dissipation module 13 in the cooling zone 27B, so that the cooling medium 21 retains a capacity to cool the electronic components 24C. In addition, the heat dissipation module 13 transfers heat from the cooling region 27B to the heat release region 27A, so that heat can be exhausted to the outside of the case 20 via the heat dissipating medium 23. As shown in FIG. 2, since the electronic component that generates high temperature is not disposed in a flow path of the heat dissipating medium 23, the temperature of the heat dissipating medium 23 being increased by the heat dissipating module 13 may not affect the overall performance of the system.

Figure 5:
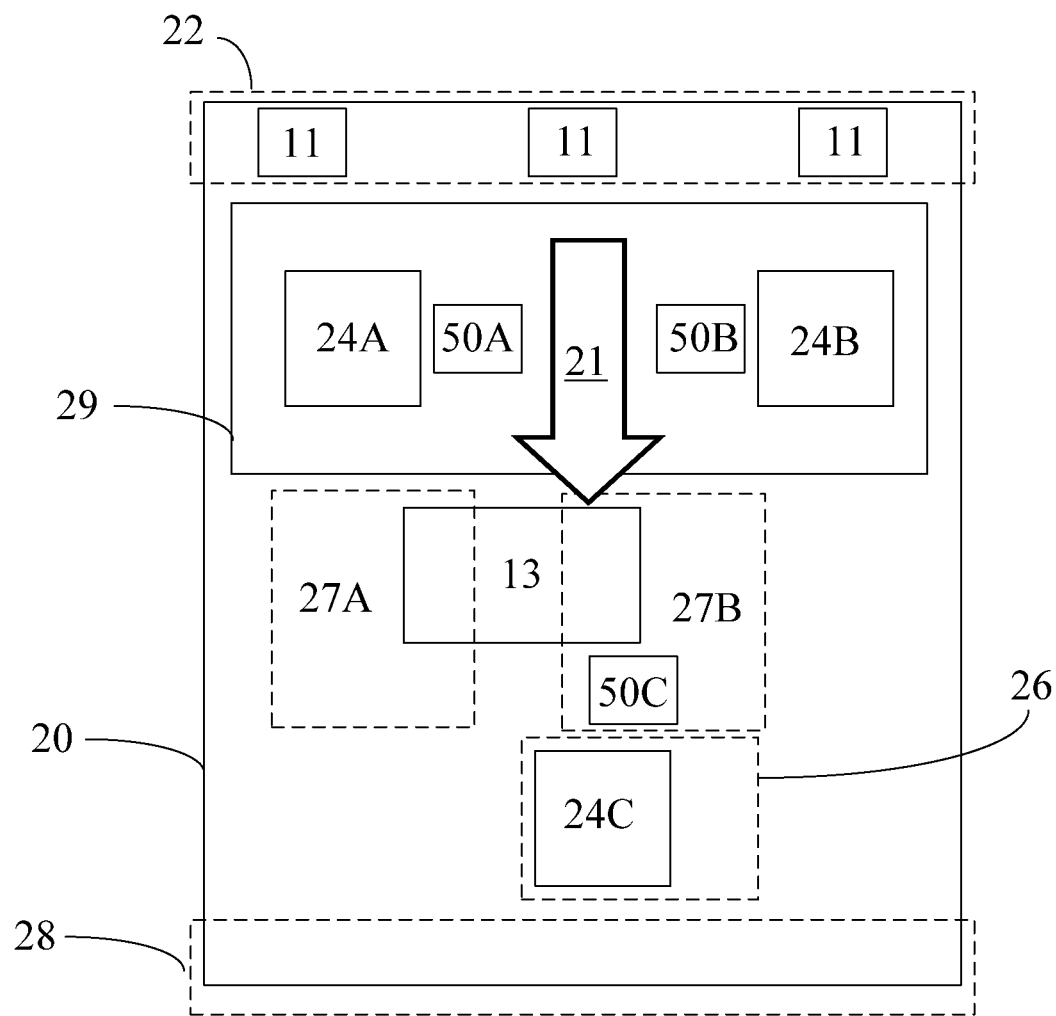
FIG. 5 is a perspective view of an electronic device according to another embodiment of the disclosure.

FIG. 5 shows another electronic device according to an embodiment of the disclosure. The electronic device comprises case 20, and the case 20 encloses an internal space. In FIG. 5, air inlet 22 comprises flow guiding devices 11. The flow guiding device 11 can be a plurality of fans. By directing the air outside the case 20 into the internal space through the flow guiding device 11, a cooling medium 21, such as cooling airflow, can be applied. The internal space enclosed by the case 20 may comprise electronic components 24A, 24B, and 24C and heat dissipation module 13. There are heat releasing region 27A, cooling region 27B, heat source region 29, and component region 26 in the internal space.

There are electronic components 24A and 24B in the heat source region 29. According to an embodiment of the disclosure, the electronic components 24A and 24B may be CPUs. The electronic components 24C in the component region 26 may be chipset components. There are temperature detectors 50A and 50B in the heat source region 29. The temperature detector 50A detects a temperature adjacent to the electronic component 24A, and the temperature detector 50B detects a temperature adjacent to the electronic component 24B. The temperature of the cooling medium 21 rises as the cooling medium 21 flows through the heat source region 29, and the temperature of the cooling medium 21 drops as the cooling medium 21 flows through the heat dissipation module 13 and approaches the electric component 24C.

According to an embodiment of the disclosure, an operating efficiency of the flow guiding device 11 can be controlled by the electronic component 24A or the electronic component 24B. The electronic component 24A can be a control circuit and the flow guiding device 11 can be a fan, the electronic component 24A controls the rotational speed of the flow guiding device 11 according to the temperatures detected by the temperature detectors 50A and 50B in a first phase, regardless of the temperature detected by the detector 50C. During the first phase, the heat dissipation module 13 continues to cool the cooling region 27B and transfer heat from the cooling region 27B to the heat release region 27A. For example, during the first phase, the temperature of the heat source region 29 can reach 60° C., and the temperature of the component region 26 can reach 70° C. Under such a condition, the electronic component 24A controls the rotational speed of the flow guiding device 11 based on the temperature detected by the temperature detectors 50A and 50B (60° C.), and cools the cooling region 27B through the heat dissipation module 13. However, when the temperature of the component region 26 continuously increases to a predetermined threshold, for example, 80° C., a second phase is initialized. In the second phase, the electronic component 24A controls the rotation speed of the flow guiding device 11 according to the temperatures detected by the temperature detectors 50A, 50B, and 50C. Thus, system inefficiency in driving the flow guiding device 11 at a maximum power, resulting in power waste, may be avoided.

According to the embodiments of the disclosure, the heat dissipation module with the thermoelectric cooling device cools the area where heat accumulation is estimated to occur, and transfers heat to the area where heat can be dissipated. This is efficient and is effective in preventing the system from overheating. Furthermore, since the power consumption of the thermoelectric cooling device is lower than that of the fan, the electronic device disclosed herein uses the thermoelectric cooling device to assist the fan to dissipate heat. When the heat dissipation is insufficient after a predetermined period, the power of the fan can be increased, thereby avoiding wasting power.

Many details are often found in the art such as the other features of heat dissipation from electronic components. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An electronic device comprising:
a case enclosing an internal space, wherein the internal space comprises a cooling region, a heat source region and a heat releasing region;
a first flow guiding device being adapted for guiding a cooling medium into the internal space;
a heat dissipation module comprising a first cooling device having a first cold side and a first hot side, the first cooling device being adapted for exchanging heat from the first cold side to the first hot side, wherein the first cold side is adjacent to the cooling region, and the first hot side is adjacent to the heat releasing region;
an electronic component disposed on the cooling region, wherein the cooling medium is cooled by the first cold side, and flows through the cooling region to decrease a temperature of the electronic component, wherein a temperature of the cooling medium is increased when flows through the heat source region, then the temperature of the cooling medium is decreased by the first cold side, and the cooling medium flows through the cooling region to decrease the temperature of the electronic component;
a first temperature detector detecting a temperature of the heat source region and obtaining a first detection temperature;
a second temperature detector detecting a temperature of the cooling region and obtaining a second detection temperature; and
a control circuit adapted for triggering the first flow guiding device according to the first detection temperature in a first phase, and triggering the first flow guiding device according to the first detection temperature and the second detection temperature in a second phase after the first phase.

2. The electronic device of claim 1, wherein the heat dissipation module further comprises:
a first heat sink fin contacting with the first cold side; and
a second heat sink fin contacting with the first hot side.

3. The electronic device of claim 2, further comprising a second flow guiding device adapted to cool the second heat sink fin.

4. The electronic device of claim 2, wherein the heat dissipation module further comprises a second cooling device having a second cold side contacting with the first heat sink fin and a second hot side contacting with the second heat sink fin.

5. The electronic device of claim 4, wherein the first cooling device and the second cooling device are alternately enabled to perform thermal conversion.

6. The electronic device of claim 4, wherein the first cooling device and the second cooling device are thermoelectric cooling devices.

7. The electronic device of claim 1, wherein the heat dissipation module comprises a baffle between the cooling region and the heat releasing region.

8. The electronic device of claim 1, wherein the second phase is initialized when the second detection temperature exceeds a predetermined threshold temperature.

9. An electronic device comprising:
a case enclosing an internal space, wherein the internal space comprises a cooling region, a heat releasing region and a heat source region;
a first flow guiding device being adapted for guiding a cooling medium into the internal space;
a heat dissipation module disposed on the cooling region for cooling the cooling medium;
an electronic component disposed on the cooling region, wherein a temperature of the cooling medium is increased when flows through the heat source region, then the temperature of the cooling medium is decreased by the heat dissipation module, and the cooling medium flows through the cooling region to decrease a temperature of the electronic component;
a first temperature detector detecting a temperature of the heat source region and obtaining a first detection temperature;
a second temperature detector detecting a temperature of the cooling region and obtaining a second detection temperature; and
a control circuit adapted for triggering the first flow guiding device according to the first detection temperature in a first phase, and triggering the first flow guiding device according to the first detection temperature and the second detection temperature in a second phase after the first phase.

10. The electronic device of claim 9, wherein the second phase is initialized when the second detection temperature exceeds a predetermined threshold temperature.

11. The electronic device of claim 9, wherein the heat dissipation module comprises a first cooling device having a first cold side and a first hot side, the first cooling device being adapted for exchanging heat from the first cold side to the first hot side, wherein the first cold side is adjacent to the cooling region, and the first hot side is adjacent to the heat releasing region.

12. The electronic device of claim 11, wherein the heat dissipation module further comprises:
a first heat sink fin contacting with the first cold side; and
a second heat sink fin contacting with the first hot side.

13. The electronic device of claim 12, further comprising a second flow guiding device adapted to cool the second heat sink fin.

14. The electronic device of claim 12, wherein the heat dissipation module further comprises a second cooling device having a second cold side contacting with the first heat sink fin and a second hot side contacting with the second heat sink fin.

15. The electronic device of claim 14, wherein the first cooling device and the second cooling device are alternately enabled to perform thermal conversion.

16. The electronic device of claim 14, wherein the first cooling device and the second cooling device are thermoelectric cooling devices.

17. The electronic device of claim 9, wherein the heat dissipation module comprises a baffle between the cooling region and the heat releasing region.

* * * * *